United States Patent [19]
Inaba

[11] Patent Number: 5,914,179
[45] Date of Patent: Jun. 22, 1999

[54] FLEXIBLE CIRCUIT BOARD AND PRODUCTION METHOD THEREFOR

[75] Inventor: Masaichi Inaba, Ushiku, Japan

[73] Assignee: Nippon Mektron Ltd., Tokyo, Japan

[21] Appl. No.: 08/994,858

[22] Filed: Dec. 19, 1997

Related U.S. Application Data

[62] Division of application No. 08/724,080, Sep. 30, 1996, Pat. No. 5,759,417.

[30] Foreign Application Priority Data

Oct. 3, 1995 [JP] Japan .................................. 7-279726

[51] Int. Cl.$^6$ .......................................................... B44C 1/22
[52] U.S. Cl. ................................ 428/209; 216/20; 216/51
[58] Field of Search ..................... 216/13, 14, 18, 216/20, 51; 427/96, 97; 29/852; 428/209, 131, 137, 138; 174/254, 259, 265, 266

[56] References Cited

U.S. PATENT DOCUMENTS

| | | |
|---|---|---|
| 3,832,769 | 9/1974 | Olyphant et al. ..................... 216/18 X |
| 4,604,160 | 8/1986 | Murakami et al. . |
| 5,160,409 | 11/1992 | Moore et al. .............................. 216/13 |
| 5,317,801 | 6/1994 | Tanaka et al. ........................ 216/20 X |
| 5,448,020 | 9/1995 | Pendse . |
| 5,759,417 | 6/1998 | Inaba ........................................ 216/18 |

*Primary Examiner*—William Powell
*Attorney, Agent, or Firm*—Alix, Yale & Ristas, LLP

[57] ABSTRACT

A desired circuit wiring pattern is formed by plating a conductive layer having excellent resistance at least to an etching solution on a metal layer which is removed in the post-process by etching. A surface protective layer having a hole for exposing part of the circuit wiring pattern is formed on both sides of the circuit wiring pattern at a predetermined position as an external connection terminal portion. The circuit wiring pattern can be formed in multiple layers by coating the conductive layer with a circuit wiring layer of another conductive material and a bump is formed to fill the hole as required.

12 Claims, 2 Drawing Sheets

FLEXIBLE CIRCUIT BOARD AND PRODUCTION METHOD THEREFOR

This is a divisional application of application Ser. No. 08/724,080 filed on Sep. 30, 1996, now U.S. Pat. No. 5,759,417.

BACKGROUND OF THE INVENTION

1. Field of the Invention

This invention relates generally to a flexible circuit board and a production method therefor and, more specifically, to a flexible circuit board having external connection terminal portions formed like lands or bumps to be electrically connected with various electric or electronic parts or a circuit wiring portion on both front and rear surfaces of a circuit wiring pattern and a production method therefor.

2. Description of the Related Art

This type of flexible circuit board is now widely used in various fields as wiring means suitable for use in electronic devices and the like. Particularly, as means for producing a flexible circuit board having fine external connection terminal portions, there is known a technique shown in FIG. 2.

That is, as shown in FIG. 2a, a desired circuit wiring pattern 23 is first formed on one side of an appropriate flexible insulating base material 20. And a metal mask 21 required for the processing of removing part of the insulating base material 20 which will be described in the subsequent step is formed on the other side of the insulating base material 20. A hole 22 is suitably formed in the metal mask 21 by photoetching means at a position corresponding to a predetermined portion of the circuit wiring pattern 23.

An adhesive 24 is used to adhere an appropriate insulating film 25 to the exposed side of the circuit wiring pattern 23 to form a surface protective layer. During formation of this surface protective layer, as shown in FIG. 2a, a predetermined portion of the circuit wiring pattern 23 is exposed to form a conductive hole 26. This surface protective layer may be formed by photolithography means which uses an appropriate photosensitive resin material, in addition to the above technique which employs the above adhesive 24 and the insulating film 25. Thereby, a desired conductive hole 26 can be formed finely with high accuracy.

Then, as shown in FIG. 2b, an excimer laser beam is irradiated from the side of the metal mask 21 to abrasion remove a portion of the flexible insulating base material 20 located at the position of the hole 22 which has been described above to form a conductive hole 27 which exposes part of the surface of the circuit wiring pattern 23.

Thereafter, as shown in FIG. 2c, while the surface of the circuit wiring pattern 23 exposed on the bottom of the conductive hole 27 is suitably protected, the unnecessary metal mask 21 is removed by etching means and then, as shown in FIG. 2d, a conductive metal such as copper is filled into the conductive holes 26 and 27 by plating means. This forms bumps 28 and 29 one ends of which are electrically connected with predetermined portions of the circuit wiring pattern 23 and the other ends of which project outward suitably can be formed.

However, the above production method for a flexible circuit board employs a double-sided copper laminated sheet as a material for forming a desired circuit wiring pattern 23 and metal mask 21 on the respective sides of the flexible insulating base material 20 separately. This double-sided copper laminated sheet is generally expensive.

As means for forming the conductive hole 27 at a predetermined position of the circuit wiring pattern 23, an excimer laser machine must be used. However, this machine is extremely expensive and it is therefore very difficult to provide this type of flexible circuit board having fine external connection terminal portions at a low cost in such circumstances.

SUMMARY OF THE INVENTION

It is therefore an object of the invention to provide a flexible circuit board which has land-shaped or bump-shaped fine terminal portions for external connection at predetermined positions on both sides of a circuit wiring pattern and which has a structure that allows for low-cost production thereof and a production method therefor.

To this end, the method for producing a flexible circuit board according to the present invention comprises the steps of:

forming a resist layer required for the formation of a desired circuit wiring pattern on one side of a metal layer which can be removed by etching;

forming a circuit wiring pattern on the exposed surface of the metal layer on the side of the resist layer by forming a conductive layer of a conductive material having resistance at least to an etching solution by plating means;

peeling off and removing the resist layer;

forming on the circuit wiring pattern a surface protective layer having a hole for exposing a predetermined portion of the circuit wiring pattern;

removing the metal layer by etching means;

forming another surface protective layer having a hole for exposing a predetermined portion of the circuit wiring pattern on the other side of the circuit wiring pattern; and thereby forming exposed terminal portions for external connection on both sides of the circuit wiring pattern at the positions of the holes.

In this respect, the step of forming a circuit wiring layer by coating another conductive material onto the conductive layer having resistance to an etching solution by plating means may be added to the step of forming the above circuit wiring pattern.

The step of forming external connection bumps one ends of which are electrically connected with the surface of the circuit wiring pattern and the other ends of which project outward by filling a conductive material into the holes by plating means may be added in the last stage.

Each of the surface protective layers is preferably formed with high accuracy by photolithography which uses a photosensitive resin material.

In a flexible circuit board in which both sides of a circuit wiring pattern are covered by a surface protective layer, by employing the above described technique, it is easy to provide land-shaped exposed terminal portions for external connection at the positions of holes formed in the surface protective layers. Moreover, by filling a conductive material into the holes, it is possible to easily form a flexible circuit board having an external connection bump structure which can be mounted to an electronic part such as a bare chip.

DESCRIPTION OF THE PREFERRED EMBODIMENT

The present invention is described hereinunder in more detail with reference to an embodiment of the present invention shown in the accompanying drawings. FIGS. 1a to 1f are diagrams showing the production steps of a flexible circuit board capable of forming fine exposed terminal portions for external connection according to the embodiment of the present invention.

Figure 1A:
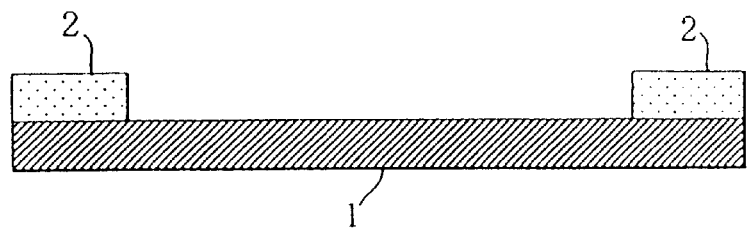
FIGS. 1a to 1f are diagrams showing the production steps of a flexible circuit board according to an embodiment of the present invention.

In FIG. 1a, a resist layer 2 required for the formation of a desired circuit wiring pattern is suitably formed on one side of a metal layer 1, such as stainless steel or copper, which can be removed by etching means, by coating a resist material, exposing to light and developing.

Figure 1B:
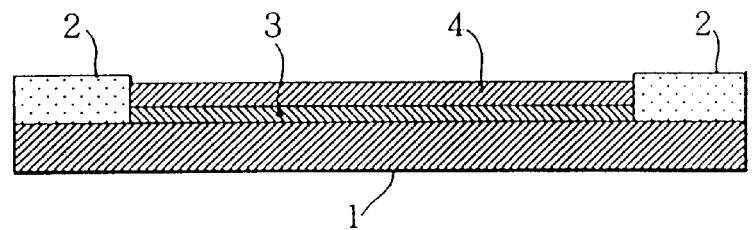

Thereafter, as shown in FIG. 1b, a conductive layer 3 is formed by plating means using a conductive metal having excellent corrosion resistance such as gold which may not be removed by an etching solution on the exposed surface of the metal layer 1 on the side where the resist layer 2 is formed. Further, a circuit wiring layer 4 is formed by plating means using a good conductive material such as copper on top of the conductive layer 3. Thus a circuit wiring pattern is constituted by these conductive layer 3 and circuit wiring layer 4.

Figure 1C:
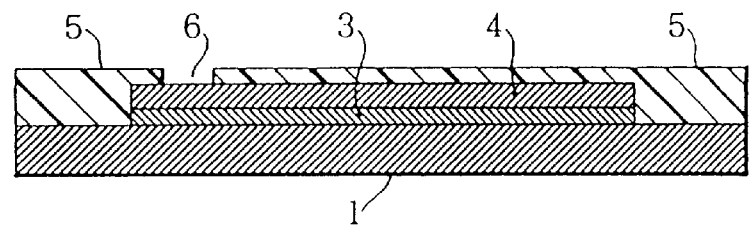

Then, as shown in FIG. 1c, after the resist layer 2 has been peeled off and removed, an insulating surface protective layer 5 is formed on top of the circuit wiring layer 4 constituting the circuit wiring pattern. At the same time as this, a hole 6 for exposing a predetermined portion of the circuit wiring layer 4 is formed. This surface protective layer 5 can be formed together with the above exposure hole 6 through a series of steps consisting of coating an appropriate photosensitive resin material such as a photosensitive polyimide resin, exposing to light, developing, heating and the like.

Figure 1D:
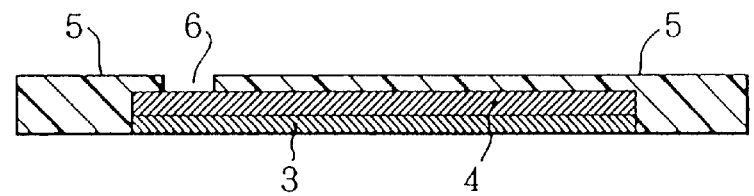
Figure 1E:
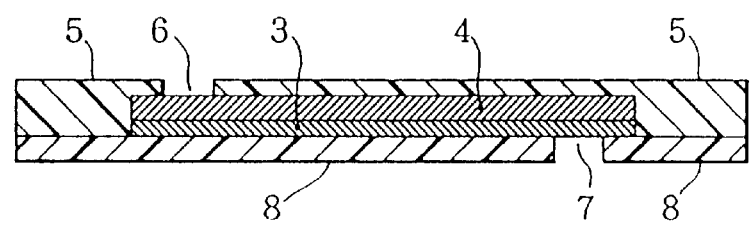

Thereafter, as shown in FIG. 1d, when the metal layer 1 which is now unnecessary is removed by etching means, as shown in FIG. 1e, another surface protective layer 8 is suitably formed from a photosensitive resin on the external surface of the conductive layer 3 in such a manner that a hole 7 for exposing a predetermined portion of the conductive layer 3 is formed at the same time by the same technique as described above.

Owing to the above steps, an exposed terminal portion for external connection can be arranged at the positions of the hole 6 and 7 which can be formed finely at predetermined positions on both sides of the circuit wiring pattern covered by a surface protective layer and constituted by the conductive layer 3 and the circuit wiring layer 4.

Figure 1F:
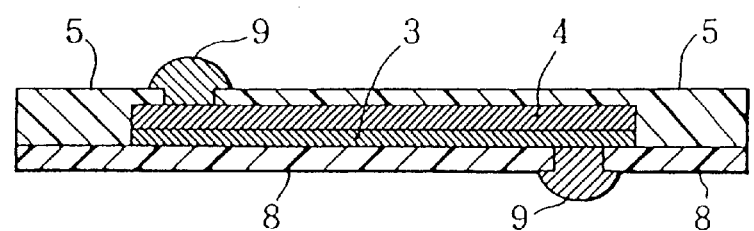
Figure 2A:
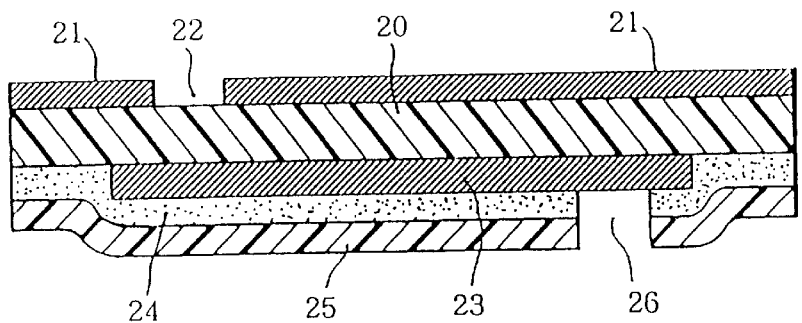
FIGS. 2a to 2d are diagrams showing the production steps of a flexible circuit board according to the prior art.
Figure 2B:
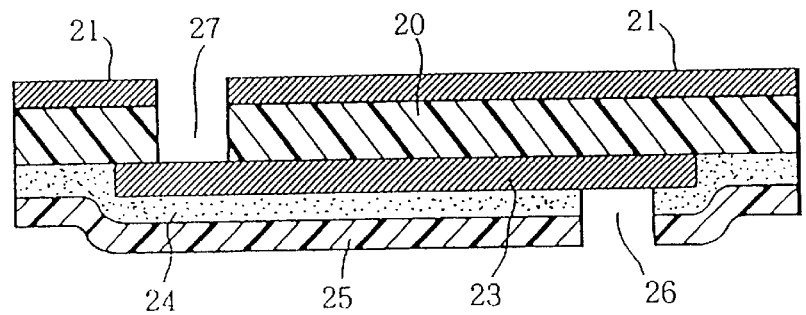
Figure 2C:
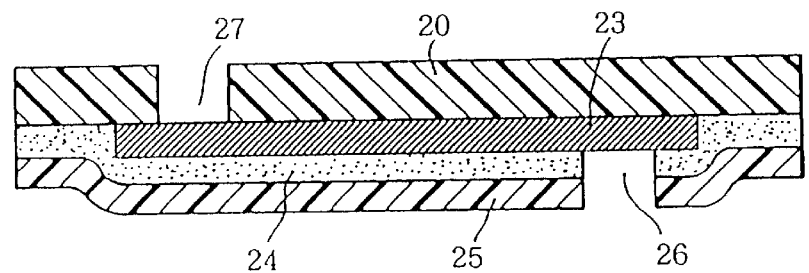
Figure 2D:
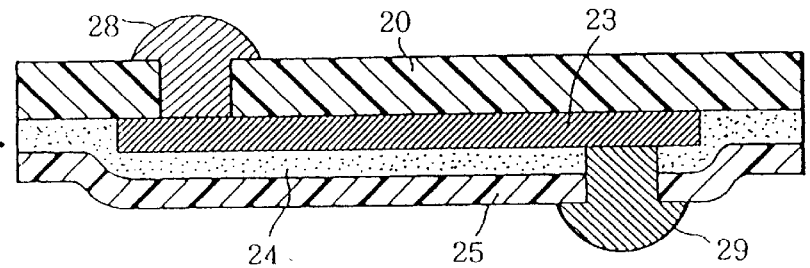

Further, as shown in FIG. 1f, the step of filling a conductive material such as copper into the above holes 6 and 7 by plating means is employed to manufacture a flexible circuit board having bumps 9 one ends of which are electrically connected with the above circuit wiring pattern and the other ends of which project toward the outside of the surface protective layers 5 and 8 formed therein separately.

By employing the above technique, it is easy to form a flexible circuit board having external connection terminal portions which can be formed finely and like a land at the positions of the exposure holes 6 and 7 on the both sides of the circuit wiring pattern constituted by the conductive layer 3 and the circuit wiring layer 4.

In the step of forming a circuit wiring pattern as shown in FIG. 1b, it is possible to form a circuit wiring pattern by the highly resistant conductive layer 3 only without forming the circuit wiring layer 4. It is also possible to constitute a flexible circuit board covered by the surface protective layers 5 and 8 having holes 6 and 7 for forming desired external connection terminal portions on both sides of the above circuit wiring pattern by the above-described technique, respectively.

Likewise, it is possible to manufacture with ease a flexible circuit board having the above-described bumps at predetermined positions on both sides of the circuit wiring pattern which is constituted by the above highly resistant conductive layer 3 only.

According to the present invention, the need to use an expensive double-sided copper laminated sheet for the formation of a circuit wiring pattern as in the prior art is eliminated and it is possible to provide at a low cost a flexible circuit board having land-shaped external connection terminal portions or bumps which can be formed finely at predetermined positions on both sides of a circuit wiring pattern without preparing an expensive facility such as an excimer laser machine.

Further, according to the present invention, it is possible to form finely a desired circuit wiring pattern having a single-layer or multi-layer structure by plating means and to provide a high-function flexible circuit board having the above-described external connection terminal portions or bumps.

What is claimed is:

1. A flexible circuit board having a circuit wiring pattern both sides of which are covered by an insulating surface protective layer, wherein the circuit wiring pattern is formed by a conductive material having resistance to an etching solution and has exposed terminal portions for external connection at the positions of holes formed in the surface protective layers.

2. A flexible circuit board according to claim 1 which has bumps one ends of which are electrically connected with the circuit wiring pattern and the other ends of which project outward by filling a conductive material in the exposed terminal portions for external connection.

3. A flexible circuit board having a circuit wiring pattern both sides of which are covered by an insulating surface protective layer, wherein the circuit wiring pattern is constituted by a conductive material having resistance to an etching solution and a circuit wiring layer formed by coating the conductive material with another conductive material and has exposed terminal portions for external connection at the positions of holes formed in the surface protective layers.

4. A flexible circuit board according to claim 3 which has bumps one ends of which are electrically connected with the circuit wiring pattern and the other ends of which project outward by filling a conductive material in the exposed terminal portions for external connection.

5. A flexible circuit board having a two-part circuit wiring pattern both sides of which are covered by an insulating surface protective layer, wherein at least one of the two parts of the circuit wiring pattern is a conductive material having resistance to an etching solution and has exposed terminal portions for external connection where holes are formed in the surface protective layers.

6. A flexible circuit board according to claim 5 which has bumps one ends of which are electrically connected with the circuit wiring pattern and the other ends of which project outward by filling a conductive material in the exposed terminal portions for external connection.

7. A flexible circuit board having a two-part circuit wiring pattern both sides of which are covered by an insulating surface protective layer, wherein one part of the circuit wiring pattern is a conductive material having resistance to an etching solution and the other part of the circuit wiring pattern is a circuit wiring layer formed by coating the conductive material with another conductive material and wherein the circuit wiring pattern has exposed terminal portions for external connection where holes are formed in the surface protective layers.

8. A flexible circuit board according to claim 7 which has bumps one ends of which are electrically connected with the circuit wiring pattern and the other ends of which project outward by filling a conductive material in the exposed terminal portions for external connection.

9. A flexible circuit board comprising:

a circuit wiring pattern formed of a conductive material which cannot be removed by applying an etching solution thereto, the circuit wiring pattern having first and second sides;

a first insulating surface protective layer, the first protective layer being disposed on the first side of the circuit wiring pattern and having at least one hole extending therethrough to thereby expose a terminal portion of the circuit wiring pattern for external connection therewith; and a second insulating surface protective layer, the second protective layer being disposed on the second side of the circuit wiring pattern and having at least one hole extending therethrough to thereby expose a terminal portion of the circuit wiring pattern for external connection therewith.

10. A flexible circuit board according to claim 9 further comprising bumps with two ends, one end of each of the bumps being electrically connected to the circuit wiring pattern and the other end of each of the bumps projecting outwardly of the flexible circuit board, the bumps comprising a conductive material in the exposed terminal portions for external connection therewith.

11. A flexible circuit board comprising:

a circuit wiring pattern, the circuit wiring pattern including a first conductive material which cannot be removed by applying an etching solution thereto and a circuit wiring layer comprising a plating of a second conductive material;

a first insulating surface protective layer disposed on the first conductive material and having at least one hole extending therethrough to thereby expose a terminal portion of the first conductive material for external connection therewith; and a second insulating surface protective layer disposed on the circuit wiring layer and having at least one hole extending therethrough to thereby expose a terminal portion of the circuit wiring layer for external connection therewith.

12. A flexible circuit board according to claim 11 further comprising bumps with two ends, one end of each of the bumps being electrically connected with the circuit wiring pattern and the other end of each of the bumps projecting outwardly of the flexible circuit board, the bumps comprising a conductive material in the exposed terminal portions for external connection therewith.

* * * * *